US009613693B1

(12) United States Patent
Kamalanathan

(10) Patent No.: US 9,613,693 B1
(45) Date of Patent: Apr. 4, 2017

(54) METHODS FOR SETTING A RESISTANCE OF PROGRAMMABLE RESISTANCE MEMORY CELLS AND DEVICES INCLUDING THE SAME

(71) Applicant: Adesto Technologies Corporation, Sunnyvale, CA (US)

(72) Inventor: Deepak Kamalanathan, Santa Clara, CA (US)

(*) Notice: Subject to any disclaimer, the term of this patent is extended or adjusted under 35 U.S.C. 154(b) by 0 days.

(21) Appl. No.: 14/927,352

(22) Filed: Oct. 29, 2015

(51) Int. Cl.
*G11C 13/00* (2006.01)

(52) U.S. Cl.
CPC ........ *G11C 13/0064* (2013.01); *G11C 13/004* (2013.01); *G11C 13/0011* (2013.01); *G11C 13/0069* (2013.01); *G11C 13/0097* (2013.01)

(58) Field of Classification Search
CPC ............ G11C 13/0064; G11C 13/0097; G11C 13/0011; G11C 13/0069; G11C 13/004
See application file for complete search history.

(56) References Cited

U.S. PATENT DOCUMENTS

| | | | |
|---|---|---|---|
| 7,167,390 B2 | 1/2007 | Ishida et al. | |
| 7,327,603 B2 | 2/2008 | Roehr | |
| 7,715,220 B2 | 5/2010 | Tsushima et al. | |
| 8,331,128 B1 | 12/2012 | Derhacobian et al. | |
| 8,369,132 B1 | 2/2013 | Hollmer et al. | |
| 8,531,863 B2 | 9/2013 | Symanczyk et al. | |
| 8,625,331 B1 | 1/2014 | Hollmer et al. | |
| 8,902,631 B2 | 12/2014 | Sunkavalli et al. | |
| 8,934,292 B2* | 1/2015 | Costa | G11C 11/56 365/148 |
| 8,976,568 B1 | 3/2015 | Jameson, III et al. | |
| 9,007,814 B1 | 4/2015 | Derhacobian | |
| 9,025,396 B1 | 5/2015 | Koushan et al. | |
| 9,336,880 B2* | 5/2016 | Takagi | G11C 13/0069 |
| 2004/0109353 A1* | 6/2004 | Matsuoka | G11C 11/5685 365/185.2 |
| 2006/0126391 A1* | 6/2006 | Kim | G11C 16/3436 365/185.22 |
| 2008/0074918 A1* | 3/2008 | Ro | G11C 11/5678 365/163 |
| 2009/0040816 A1* | 2/2009 | Kang | G11C 13/0004 365/163 |
| 2010/0027326 A1* | 2/2010 | Kim | G11C 13/0069 365/163 |
| 2014/0269045 A1* | 9/2014 | Chu | G11C 13/0004 365/163 |

* cited by examiner

Primary Examiner — Khamdan Alrobaie

(57) ABSTRACT

A method can include applying a first electric field to a plurality of memory elements that are programmable between at least two different resistance states; verifying whether the memory elements have a resistance outside of a first limit; for memory elements that are not outside of the first limit, applying a second electric field of a same direction as the first electric field, and not applying the second electric field to those memory elements that are outside the first limit; and verifying whether the memory elements receiving the second electric field have a resistance outside of a second limit; wherein the second limit is between the first limit and a read limit, where a memory element having a resistance below the read limit is determined to store one data value, and a memory element having a resistance above the read limit is determined to store another data value.

19 Claims, 7 Drawing Sheets (BACKGROUND)

| PRE | POST |
|---|---|
| ER_Ver1 | ER_Ver1 |
| ER_Ver2<ER_Ver1 | ER_Ver2Pst ≠ ER_Ver2 |
| ER_Ver3<ER_Ver2 | ER_Ver3Pst ≠ ER_Ver3 |
| ⋮ | ⋮ |
| ER_Vern<ER_Ver(n-1) | ER_VernPst ≠ ER_Vern |

| PRE | PRE |
|---|---|
| ER_Ver1 | ER_Ver1 |
| ER_Ver2<ER_Ver1 | ER_Ver2Pst>ER_Ver2 |
| ER_Ver3<ER_Ver2 | ER_Ver3Pst>ER_Ver3 |
| ⋮ | ⋮ |
| ER_Vern<ER_Ver(n-1) | ER_VernPst>ER_Vern |

| PRE (ohms) | POST (ohms) |
|---|---|
| 1 M | 1 M |
| 500 k | 1 M |
| 200 k | 1 M |
| 100 k | 1 M |
| 50 k | 1 M |
| 30 k | 1 M |

FIG. 10A
| ADD | Rver Level | Ex Level | STATUS |
|---|---|---|---|
| 001F3 | 1 | 1 | FAIL |
| 0021A | 1 | 1 | FAIL |
| 0C182 | 1 | 1 | FAIL |
| 42214 | 1 | 1 | FAIL |
| FA110 | 1 | 1 | FAIL |
~1072
FIG. 10B
| ADD | Rver Level | Ex Level | STATUS |
|---|---|---|---|
| 001F3 | 2 | 2 | FAIL |
| 0021A | 2 | 2 | PASS |
| 0C182 | 2 | 2 | PASS |
| 42214 | 2 | 2 | FAIL |
| FA110 | 2 | 2 | PASS |
~1072
FIG. 10C
| ADD | Rver Level | Ex Level | STATUS |
|---|---|---|---|
| 001F3 | 3 | 3 | PASS |
| 0021A | 2 | 2 | PASS |
| 0C182 | 2 | 2 | PASS |
| 42214 | 3 | 3 | PASS |
| FA110 | 2 | 2 | PASS |
~1072
FIG. 11A
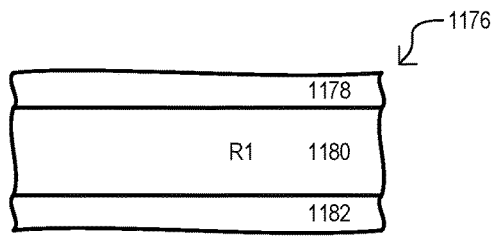
FIG. 11B
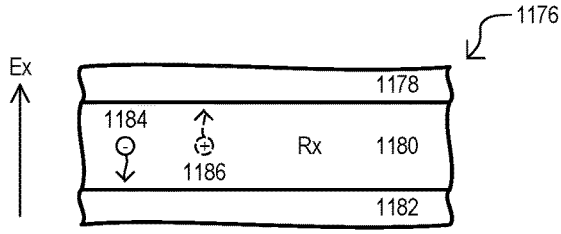
FIG. 11C
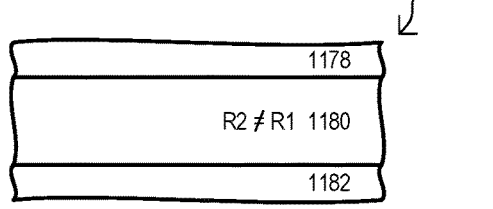

METHODS FOR SETTING A RESISTANCE OF PROGRAMMABLE RESISTANCE MEMORY CELLS AND DEVICES INCLUDING THE SAME

TECHNICAL FIELD

The present disclosure relates generally to memory devices, and more particularly to memory devices having storage elements that are programmed between different resistance states.

BACKGROUND

Programmable resistance elements can provide advantages over other conventional memory types by providing lower operating voltages at relatively high densities. Further, some programmable resistance elements can be formed at the "bank-end" of an integrated circuit manufacturing process, and not require substrate area. Thus, such elements can be easily incorporated into existing devices or processes.

One particular programmable resistance element can be a CBRAM type element. CBRAM elements can include one or more switching layers that can be programmed between two or more resistance states by application of electric fields. For example, an electric field applied in one direction can result in a higher resistance, while an electric field applied in other direction can result in a lower resistance. In some CBRAM elements, switching layers can undergo an oxidation-reduction reaction (as opposed to a phase change) to arrive at such a change in resistance. The oxidation-reduction reaction may, or may not, include ion conduction.

Some conventional CBRAM elements can be "erased" to a high resistance state by application of an electric field in a first direction and "programmed" to a low resistance state. The number of times a CBRAM element can be erased and programmed can determine its lifetime (endurance). Thus, integrated circuit (IC) devices that include such memory elements, as well as electronic device that use such ICs, can have lifetimes limited by the endurance of their memory elements.

BRIEF DESCRIPTION OF THE DRAWINGS

FIGS. 10A to 10C are diagrams showing a verify memory that can be included in embodiments.

FIGS. 11A to 11C are side cross sectional representations of memory elements that can be included in embodiments.

DETAILED DESCRIPTION

Figure 1:
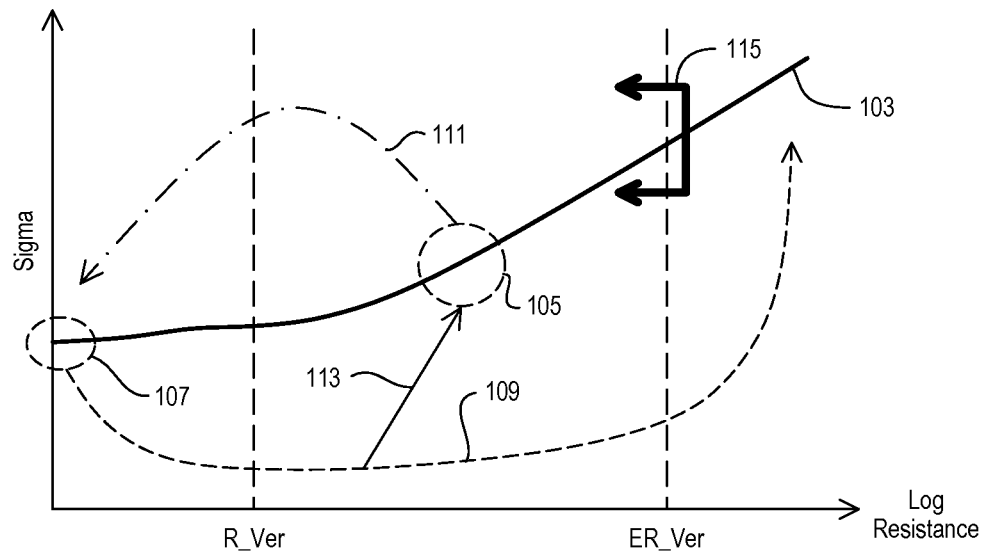
FIG. 1 is a graph showing conventional erase operations for CBRAM elements.

According to embodiments, an electric field (e.g., an "erase" voltage) can be applied to multiple programmable resistance elements and a resistance of the elements can be verified at a first level, which is significantly different than a read verify level. For those elements that are not at the first level, a same polarity electric field can then be applied, and the resistance verified again, but at a second level that is closer to the read threshold resistance than the first level. These steps can be repeated (i.e., application of electric field and verification to elements that fail verification), with each verify resistance level being closer to the read verify level than the previous verify resistance level. A read verify level can be a resistance at, or close to, a resistance used to distinguish between data values stored by an element.

In some embodiments, a resistance of the elements can be set by an oxidation-reduction reaction resulting from the application of electric fields. In a particular embodiment, elements can be CBRAM type elements.

In some embodiments, application of an electric field can be an erase voltage that sets a resistance of elements to a relatively high level, representing one data value. Follow-on erase and verify operations can use consecutively lower verify resistance values. Elements can be programmed to a lower resistance, below that of the read threshold resistance.

In the embodiments disclosed herein, like sections are referred to by the same reference character but with the leading digit(s) corresponding to the figure number.

To better understand various aspects of the embodiments described herein, a conventional resistance setting method will first be described with reference to FIG. 1.

FIG. 1 is a graph showing a conventional CBRAM erase operation. FIG. 1 provides a curve 103 that shows a distribution of element resistance following an initial erase operation. Resistance values shown include an erase verify resistance (ER_Ver) and a read verify resistance (R_Ver). The ER_Ver is a resistance at which an element is considered to be erased. A read verify resistance (R_Ver) can be a resistance that determines what data value is stored by an element. In the particular embodiment shown, ER_Ver is substantially higher than R_Ver. That is, the CBRAM elements are erased to a high resistance and programmed to a low resistance.

Among the various elements subjected to the initial erase operation can be a first element, represented by region 105, and a second element, represented by region 107. As shown, first element 105 can have a resistance above R_Ver, but below ER_Ver. Second element 107 can have a resistance below that of R_Ver. This latter case can represent a "reverse program" result. In a reverse program event, an element subject to an erase polarity electric field (one that would normally result in a high resistance) can suddenly drop in resistance, as if subjected to a programming operation.

Conventionally, elements failing erase verification (i.e., elements having a resistance less than ER_Ver, such as 105 and 107) can be subjected to another erase and verification operation at ER_Ver, represented by arrows 115. However, such a conventional approach can have limits in effectiveness. This is shown by responses 109 and 111. Response 109 shows how previously "reverse programmed" element or an element not erased with an initial first pulse 107 can recover in a second erase operation, having a resistance that increases beyond ER_Ver. However, response 111 shows how an element having an intermediate resistance can itself become reverse programmed, dropping to an undesirable low resistance. Response 113 shows how this same element, when subject to another erase operation, can increase in resistance, but remain below the ER_Ver level. Thus, while the second erase and verification operation may recover some bits, such operations can result in bits cycling between resistance levels below the ER_Ver level, including resistance level that can be below the R_Ver level.

Figure 2:
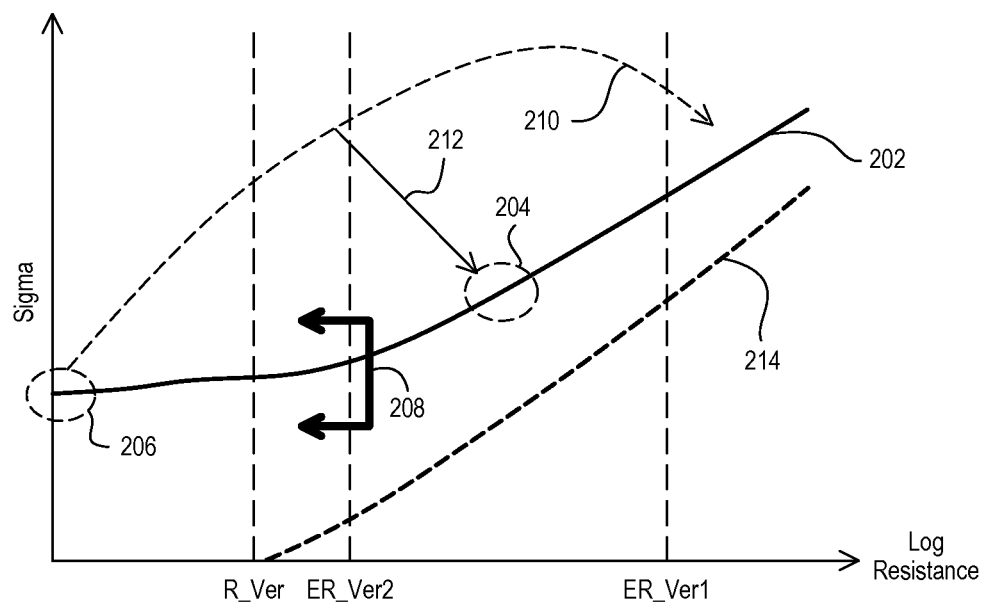
FIG. 2 is a graph showing resistance setting operations according to an embodiment.

FIG. 2 is a graph showing a resistance setting operation for elements according to an embodiment. In FIG. 2, resistance setting operations will be referred to as "erase" operations, however, it is understood that this terminology can vary according to technology employed. That is, such resistance setting operations could be referred to as programming operations for some technologies. Further, while the embodiment shows one read verify resistance, alternate embodiment that store more than one bit per element can include more than one read verify resistance.

The description of FIG. 2 will reference erase and verify operations. Such operations can include the application of an electric field, and one or more resistance reading operations (i.e., at least two separate steps). However, in alternate embodiments, such operations can include one step, where an electric field is applied and resistant monitored at the same time. In this latter case, the application of the electric field can be conditioned on the current resistance reading (i.e., the electric field is disabled once the element is in compliance with a desired resistance level).

As in the case of FIG. 1, resistance values shown include a (first) erase verify resistance (ER_Ver1) and a read verify resistance (R_Ver). However, unlike FIG. 1, FIG. 2 also shows a second verify resistance ER_Ver2. Second verify resistance can be between ER_Ver1 and R_Ver.

FIG. 2 shows a curve 202, which represents a resistance distribution following a first erase and verify operation. Such a first erase and verify operation can be applied to all elements of a selected group. A resistance verification level for the first erase operation can be ER_Ver1. As in the case of FIG. 1, following an initial erase operation, there can be a first element 204 and second element 206, which can provide responses like those of elements 105 and 107, respectively, of FIG. 1.

However, unlike FIG. 1, following the first erase and verify operation, a second erase and verify operation can be conducted with ER_Ver2 as the second verify resistance. This is shown by arrows 208. It is understood that the second erase and verify operation 208 is conditionally performed only on those elements that fail the first erase and verify operation (i.e., those with a resistance less than ER_Ver2).

Because first element 204 has a resistance above ER_Ver2, it is left alone, and so can remain at its current resistance. This is in contrast to the conventional case of FIG. 1, where a second erase operation can adversely affect an out of compliance element, including causing a "reverse program" of the element.

In contrast, second element 206, is subject to the second erase verify operation 208, and can increase in resistance. Response 210 shows how a second verify and erase operation can cause element 206 to be in compliance with ER_Ver1. Response 212 shows how a second element 206 may not be in compliance with ER_Ver1, but can still be greater than R_Ver.

By performing a second erase and verify at a lower verify resistance, elements at the "tail" of a resistance distribution (i.e., those with a very low resistance like element 206) can be brought into compliance, while not forcing other elements out of compliance (i.e., response 111 shown in FIG. 1). Consequently, a distribution in resistance can be reduced, as shown by curve 214.

In some embodiments, second erase conditions can vary from the first erase conditions. For example, second erase conditions may impart more energy on targeted elements. As but a few examples, second erase conditions can include a higher voltage, longer duration, a different waveform, or various combinations thereof. However, the electric field for the second erase operation is the same direction across the element as that of the first erase operation.

As noted, a second verify resistance ER_Ver2 can be between ER_Ver1 and R_Ver. In some embodiments, ER_Ver2 can be considerably less than ER_Ver1. ER_Ver2 can be less than ½ER_Ver1. In some embodiments, ER_Ver2 can be less than 25% of ER_Ver1. In other embodiments, ER_Ver2 can be less than 15% of ER_Ver1. In some embodiments, a difference in resistance between ER_Ver2 and R_Ver can be no more than ½R_Ver.

In one very particular embodiment, elements can be CBRAM type elements (or equivalents), and ER_Ver1 can be about 1 MΩ, R_Ver can be about 67 kΩ, and ER_Ver2 can be about 125 kΩ. Reverse programmed elements can have a resistance in the range of 10 kΩ. However, these values are provided by way of example, and should not be construed as being limiting.

Figures 3, 4A, 4B, 4C:
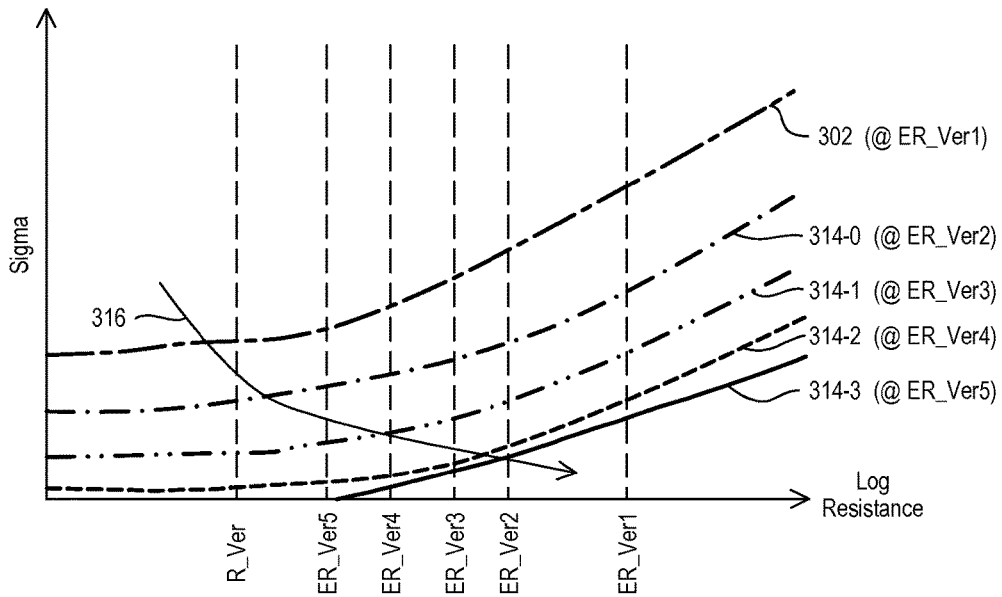
FIG. 3 is a graph showing erase and verify operations according to another embodiment.
FIGS. 4A to 4C are tables showing erase and verify operations according to various embodiments.

While the embodiment of FIG. 2 shows an arrangement that includes one follow-on erase and verify operation, alternate embodiments can include operations with more than one follow-on resistance setting step, where each verify resistance is set closer a read verify resistance than the previous verify resistance. FIG. 3 shows one particular example of such an embodiment.

FIG. 3 is a graph like that of FIG. 2, showing resistance variation. However, unlike FIG. 2, there are four follow-on erase and verify actions, at consecutively lower verify resistance values. It is understood that each follow-on erase and verify operation is performed only on those elements that are below the verify resistance of the previous operation.

Accordingly, in FIG. 3 a group of elements can be subjected to an initial erase and verify operation at the verify resistance ER_Ver1. Those elements determined to have a resistance less than ER_Ver1 can be subjected to a first follow-on erase and verify operation, at a resistance ER_Ver2. Those elements determined to have a resistance less than ER_Ver2 can be subjected to a first follow-on erase and verify operation, at a resistance ER_Ver3, and so on, until a final erase and verify operation at ER_Ver5 is reached. As in the case of FIG. 2, follow-on erase operations can apply energy to a cell that can be the same as, or can be different from, the energy applied in a previous erase operation. In particular embodiments, one or more follow-on erase operations can be capable of imparting more energy on the selected elements than a previous erase operation.

With each follow-on erase and verify operation, more and more "tail" elements can be brought into compliance without forcing other elements out of compliance. Consequently, with each follow-on erase and verify, the distribution in element resistance can be reduced, as shown by arrow 316, which shows a direction of curves 302 and 314-0 to -3. Curve 302 shows an element resistance variation after an initial erase and verify operation (at a verify resistance ER_Ver1). Curves 314-0 to -3 show resistance variation of the elements following four follow-on erase and verify operations at consecutively lower verify resistance values of ER_Ver2, ER_Ver3, ER_Ver4 and ER_Ver5, respectively.

In some embodiments, a final verify resistance (in this embodiment ER_Ver5) can be in the same ranges as noted for ER_Ver2 in FIG. 2. That is, ER_Ver5 can be any of: less than ½ER_Ver1; less than 25% of ER_Ver1; less than 15% of ER_Ver1; or a difference between the final verify resistance (e.g., ER_Ver5) can be between the resistance and R_Ver can be no more than ½R_Ver.

In one very particular embodiment, elements can be CBRAM type elements (or equivalents), and ER_Ver1 can be about 1 MΩ, R_Ver can be about 67 kΩ, ER_Ver2, ER_Ver3, ER_Ver4 and ER_Ver5 can be about 500 kΩ, about 300 kΩ, about 200 kΩ, and about 125 kΩ, respectively. However, these values are provided by way of example, and should not be construed as being limiting.

According to some embodiments, each of multiple follow-on operations can include both a first verify operation (a "pre" verify) as well as a second verify operation (a "post" verify). Elements found out of compliance with the post resistance can be subject to a next follow-on operation, while those in compliance are excluded from follow-on operations.

FIGS. 4A to 4C show pre and post erase and verify operations according to some embodiments. FIG. 4A is a table having columns showing pre and post verify resistances for an initial and follow-on erase and verify operations according to an embodiment. As shown, in the initial erase and verify, pre and post verify resistance values are the same (PRE=POST=ER_Ver1). Further, a pre verify resistance for each follow-on operation be lower than a previous operation (i.e., ER_Ver1>ER_Ver2>ER_Ver3, etc.). However, each post verify resistance can be different than its corresponding pre verify resistance.

FIG. 4B is a table having columns showing pre and post verify resistance for an initial and follow-on erase and verify operations according to another embodiment. FIG. 4B includes values like those of FIG. 4A, except that each post verify resistance can be greater than its corresponding pre verify resistance.

FIG. 4C is a table showing one very particular implementation of that shown in FIG. 4B. FIG. 4C can represent pre and post verify resistances for five follow on operations for CBRAM type elements. As shown, for each follow-on erase and verify operation, a post verify resistance can be the same as an initial verify resistance, and thus greater than all pre verify resistance values.

Embodiments described herein can include operations that initially "erase" elements to a high resistance state, and use one or more follow-on operations which can change "tail" elements in a distribution (those with very low resistance) to a high resistance state. However, alternate embodiments, employing different element types, can include resistance setting operations that can place elements into a low resistance state, and use follow-on operations to move "tail" elements with a high resistance to the low resistance state. One such alternate embodiment is shown in FIG. 5.

Figure 5:
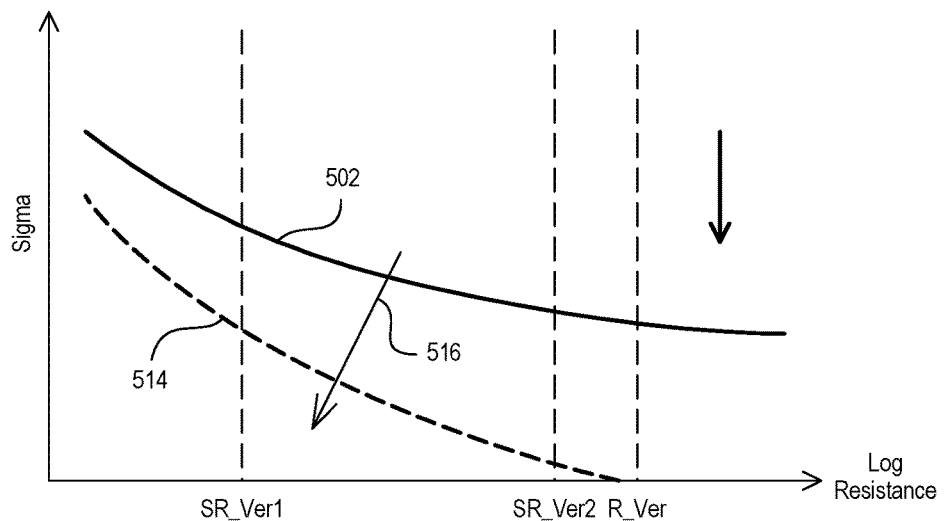
FIG. 5 is a graph showing resistance setting operations according to another embodiment.

FIG. 5 is a graph showing a resistance setting operation according to an embodiment. FIG. 5 includes items like those of FIG. 2, however, resistance changes occur in the opposite direction. Accordingly, in FIG. 5, an initial resistance setting operation on a group of elements can result in resistance variation distribution represented by 502. Such an initial resistance setting operation can apply an electric field which can cause a change in element resistance, and resistance of the element can be verified to be less than SR_Ver1. Those elements failing the verification can be subject to a follow-on resistance setting operation, but at a resistance (SR_Ver2) that is between SR_Ver1 and a read verification resistance R_Ver.

As a result, a resistance variance can be reduced as shown by curve 514 and direction arrow 516.

While FIG. 5 shows one follow-on resistance setting operation to bring elements to a low resistance, alternate embodiments can include more than one follow-on resistance setting operation, like that shown in FIGS. 3 to 4B, but with each follow-on verification resistance being higher than a previous verification resistance.

Figure 6:
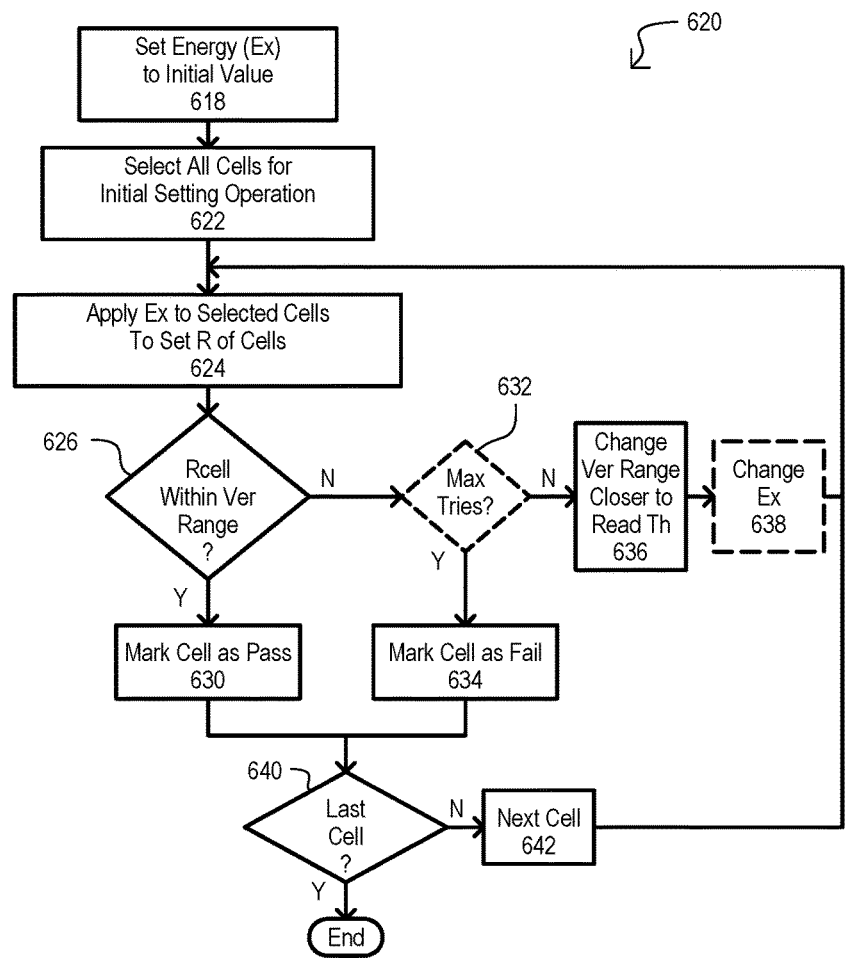
FIG. 6 is a flow diagram of a resistance setting method according to an embodiment.

FIG. 6 is a flow diagram of a method 620 according to an embodiment. A method can include setting an initial energy value (Ex) 618. Such an action can include setting the characteristics of one or more electric pulses that will be applied to a group of cells to set a resistance of their element(s). Such characteristics can include, but are not limited to, voltage magnitude, pulse duration, number of pulses, pulse shape, or current compliance (e.g., maximum and/or minimum current allowed to flow). All cells can be selected for an initial resistance setting operation 622 (only out of compliance elements being subject to follow on-operations).

A method 620 can include applying a current energy (Ex) to the current selected set of cells to set the resistance of such cells 624. It is understood that a first iteration can include all elements at the initial Ex value. An action 624 can include applying the energy to cells individually, or to multiple cells simultaneously, or combinations thereof. In a particular embodiment, an initial setting operation (to all cells) can be simultaneous, while follow-on setting operations (to cells out of compliance) can be done to individual elements.

Following the application of resistance setting energy to elements, a cell resistance (Rcell) can be checked to see if it is in a desired verification range (Ver Range) 626 (i.e., if the cell is in compliance with a current resistance range). If Rcell is within a current Ver Range (Y from 626), it is marked as passing 630. If Rcell is not within a current Ver Range (N from 626), optionally, a check can be made to see of a maximum number of tries (i.e., follow-on resistance setting operations) has been reached 632. If a maximum number of tries has been reached (Y from 632), a cell can be marked as failing 634.

However, if a cell fails a verification (i.e., 626) and if a maximum number of tries has not yet been reached (N from 632), a method 620 can change a current Ver Range to one that is closer to a read threshold value (Rth) 636. The change in Ver Range sets a verify resistance for a next, follow-on resistance setting operation. Rth can be a resistance value at which a determination can be made between logic values stored by a cell (i.e., if Rcell>Rth, it can store a "0", and if Rcell<Rth, it can store a "1").

Optionally, once a new Ver Range value has been set, a new energy (Ex) can be set 638. Alternatively, Ex can be kept the same for some, or all follow-on resistance setting operations.

Once a new Ver Range value has been selected, follow-on resistance setting operations can proceed by returning to 624.

Once a cell has been marked as pass or fail, if it is a last cell (Y from 640) an operation 620 can end. If it is not last cell (N from 640), a next cell can be selected 624, and an operation can return to 624.

Figure 7:
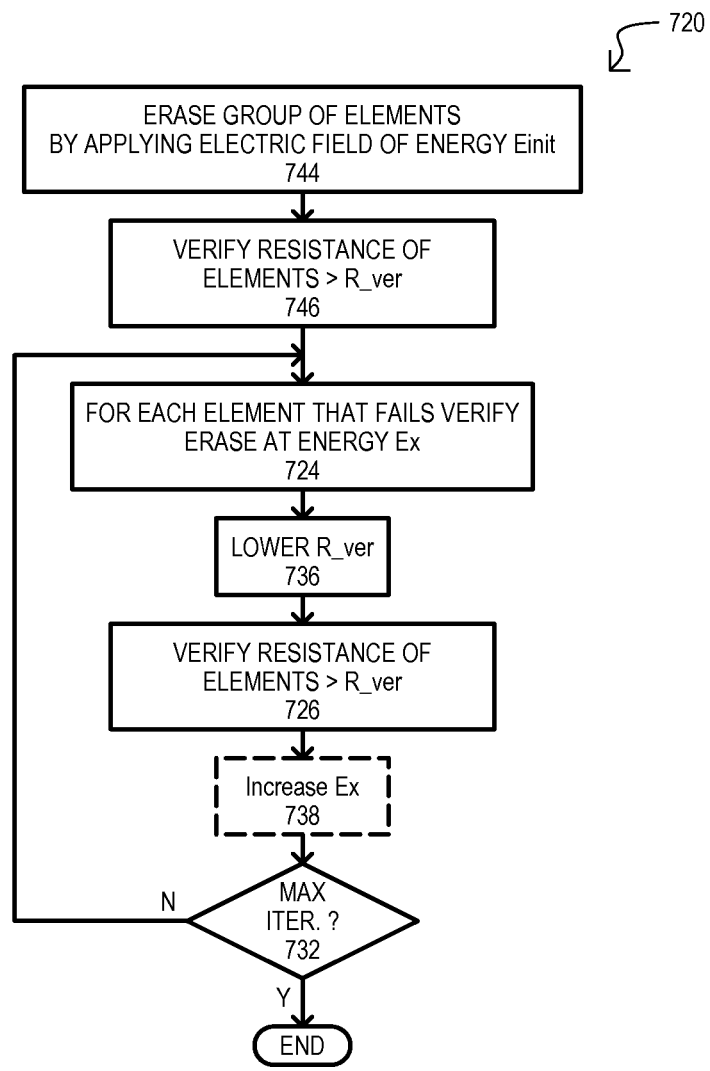
FIG. 7 is a flow diagram of erase and verify operations according to an embodiment.

FIG. 7 shows a method 720 according to another embodiment. A method 720 can be an erase method for programmable resistance elements. A method 720 can erase elements to a high resistance for subsequent programming to a low resistance according to a data value to be stored.

A method 720 can include erasing a group of programmable resistance elements by applying an electric field of energy Einit 744. In some embodiments, such an action can include applying one or more voltage pulses across the terminals of the elements. A resistance of the elements can be verified to be greater than a verification resistance R_ver 746.

Each element that fails the verification step (i.e., its resistance is less than R_ver) can be subject to a follow-on erase operation at an energy Ex 724. Such an erase operation can apply an electric field in the same direction as that of the initial erase operation (744). In some embodiments, Ex can be the same as Einit. However, in other embodiments, Ex can be different from Einit. An erase verification resistance R_ver can be lowered 736, and an element resistance can be verified to be greater than the lower R_ver 726. Such a lower follow-on verification resistance can be subject to the variations described for embodiments herein. Optionally, an erase energy (Ex) can be increased for a next follow-on erase operation 738.

In the particular embodiment shown, a method 720 can determine a maximum number of iterations has been performed 732. If a maximum number of iterations has not been reached (N from 732), a method can return to 724 and execute another follow erase and verify operation at an even lower resistance. If a maximum number of iterations has been reached (Y from 732), a method can end.

Figure 8:
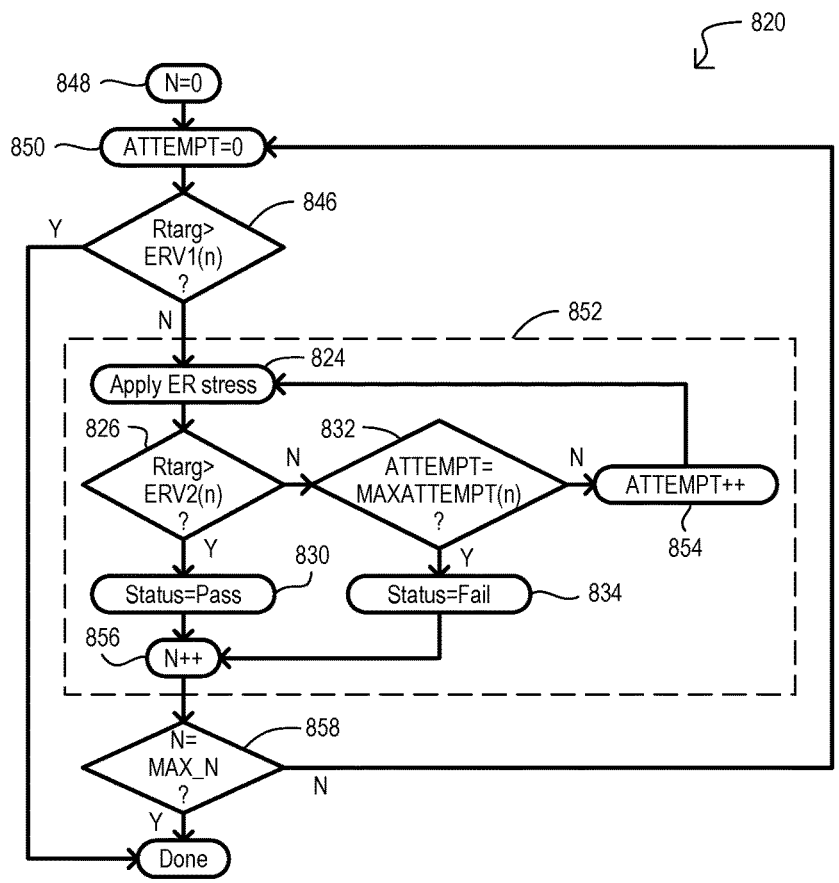
FIG. 8 is a flow diagram of erase and verify operations according to another embodiment.

FIG. 8 is a flow diagram of a method 820 according to a particular embodiment. A method 820 show operations for erasing CBRAM type elements to a high resistance, which can move very low resistance tail elements to a high resistance, while reducing the chance of "reverse programming" elements back to a low resistance.

In some embodiments, a method 820 can be preceded by an initial erase operation, which can attempt to erase an element to a high resistance state. A method 820 can include setting a count N to an initial value 848. A count value N can determine how many follow-on erase and verify operations an element can be subject to. An attempt value (ATTEMPT) can also be set to an initial value 850. An attempt value can be number of times a method will perform follow-on erase and verify operations on an element at a particular set of values (e.g., erase energy and verify resistance).

Elements can be subject to a "post" resistance verification at a resistance level ERV1($n$) 846. It is noted that such a level can be subject to variation as described herein. If an element is within compliance (Y from 846), the element can be considered properly erased, and the method can end.

If an element is not within compliance (N from 846), method 820 can proceed to an inner loop 852. Within inner loop 852, elements can be subject to follow-on erase and verify operations. In the example shown, inner loop 852 can include applying an erase stress to an element 824. In some embodiments, this erase stress can be the same for all follow-on erase operations (i.e., counts of N). However, in other embodiments, erase stress can vary between follow-on operations. After application of an erase stress, an element can be subject to a "pre" resistance verification at a resistance level ERV2($n$) 826. A value of ERV2($n$) can vary for each follow-on erase operation. In particular embodiments, ERV2($n$) can be lower with each higher value of N. If an element's resistance is greater than ERV2($n$) (Y from 826), its status can be set to "pass" 830 and a value of N can be incremented 856.

If an element's resistance is no greater than ERV2($n$) (N from 826), a determination can be made to see of a maximum number of attempts has been reached for the current erase stress and ERV2($n$) verify level 832. If a maximum number of attempts has been reached (Y from 832), its status can be set to "fail" 834 and a value of N can be incremented 856. If a maximum number of attempts has not been reached (N from 832), a method 820 can undergo another iteration within inner loop 852, returning to 824, and applying the erase stress. In some embodiments, a maximum attempt limit (MAXATTEMPT(n)) can vary with each follow-on operation (i.e., each value of N).

After a value N has been incremented, a check can be made to see if a maximum value for N has been reached (858) (i.e., it was the last follow-on operation). If a maximum value for N is not reached (N from 858), a method 820 can proceed to a next follow-on operation, by returning to 850, to reset the ATTEMPT value, and proceeding to another "pre" resistance verify 846. If a maximum value for N is reached (Y from 858), a method 820 can end with an element having a particular status (i.e., pass or fail).

In one very particular embodiment, a method 820 can include values like those of FIG. 4C. Where N can be 5, the value of ERV1($n$) remains at 1M, and the value of ERV2($n$) follows those of the PRE column.

Figure 9:
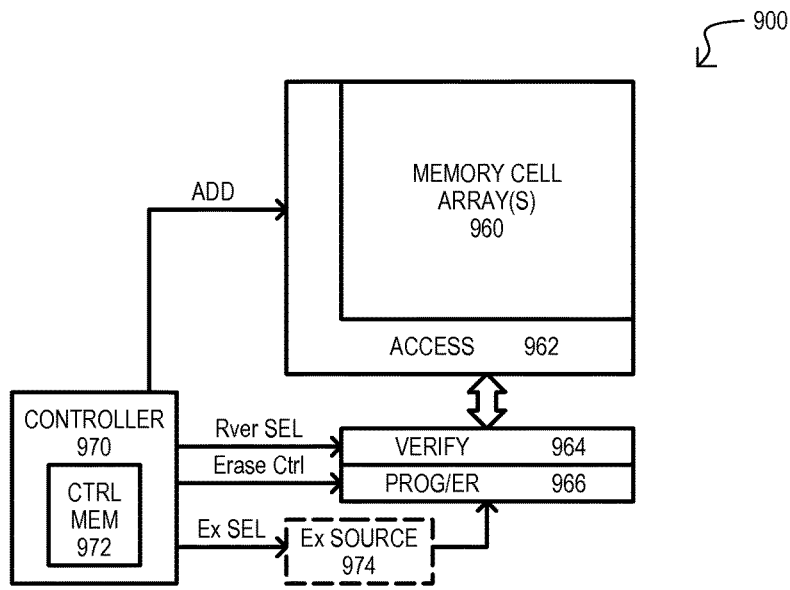
FIG. 9 is a block schematic diagram of device according to an embodiment.

FIG. 9 is a block diagram of a device 900 according to an embodiment. A device 900 can include one or more memory cell arrays 960, access circuits 962, verify circuits 964, program/erase circuits 966, and a controller 970. Memory cell array 960 can include memory cells that each include one or more programmable resistance elements that are programmable between different resistance states by application of electric fields. In some embodiments, each memory cell can include an access device, such as a transistor, and a two terminal element. However, in alternate embodiments, each memory cell can include more than one element and/or more than one access device. In other embodiments, memory cells can be formed by but one element (e.g., arranged in a cross point array configuration). In a particular embodiment, each memory cell can include an n-channel type transistor and a CBRAM type element.

Access circuits 962 can enable access to memory cells according to address values ADD. In some embodiments, access circuits 962 can include decoder circuits, including row and/or column decoders. In some embodiments, access circuits 962 can also provide limited access to some memory cells (e.g., boot blocks or the like).

Verify circuits 964 check if a resistance of memory cells (or their elements) is within a range. Such ranges can be single ended (e.g., some minimum resistance or some maximum resistance), or can be bounded (e.g., a minimum and maximum). According to embodiments, verify circuits 964 are designed to verify at least two different resistance levels (i.e., an initial verify resistance and at least one follow-on resistance). In the particular embodiment shown, a verify resistance for a verify circuit 964 can be determined by a control input Rver SEL. Verify circuits 964 can perform resistance verify operations according to the embodiments described herein, or equivalents.

Program/erase circuits 966 can set a resistance of memory cells by application of an electric field through access circuits 962. In some embodiments, memory cells within array(s) 960 can be erased to a high resistance than selectively programmed to one or more lower resistances according to a data value to be stored. However, in other embodiments, memory cells can be erased to a low resistance and selectively programmed to a high resistance. In the embodiment shown, erase operations can be controlled according to erase control inputs Erase Ctrl.

A controller 970 can control erase and verify operations to perform operations as described herein, or equivalents. In particular, controller 970 can provide control inputs Rver SEL and Erase Ctrl to verify circuits 964 and program/erase circuits 966 that enable such circuits to perform initial erase and verify operations, followed by one or more follow-on erase and verify operations at different resistance levels, according to embodiments described herein, or equivalents.

Optionally, a device 900 can include an erase energy source 974 that can provide an erase energy Ex to program/erase circuits 974. The amount of energy Ex provided can be selectable according to a value Ex SEL. As but one example, energy source 974 can provide erase voltage pulses that can vary as noted herein or equivalents (e.g., voltage magnitude, duration, shape, etc.). In this way, according to values Ex SEL provided by controller 970, erase energies can be varied between different follow-on erase operations.

Referring still to FIG. 9, a device 900 can also include a verify memory 972. A verify memory 972 can store values for memory cells undergoing follow-on erase and verify operations. In particular, a controller 970 can track a location (e.g., address) for each memory cell undergoing a follow-on operation, as well as its current verification resistance, current erase energy, and any other variables used in the operations (e.g., maximum attempts for each follow-on operation, maximum number of follow-on operations, etc.).

FIGS. 10A to 10C are diagrams showing examples of a verify memory 1072 that can be included in embodiments. A verify memory 1072 can store information on memory cells that fail an initial erase and verify, and are subject to follow-on erase and verify operations. In the particular example shown, verify memory 1072 can include address information (ADD), a current verify resistance level (Rver Level), a current erase energy level (Ex Level), and a status value (STATUS).

FIG. 10A shows a verify memory 1072 following an initial erase and verify operation. Data for elements that do not comply with the initial verify resistance are stored. While a STATUS value shows FAIL, in other embodiments, at this initial point in operation such a value may not be set, and so can be considered "not valid".

FIG. 10B shows a verify memory 1072 following a first follow-on erase and verify operation. As shown, three memory cell/elements have recovered, while two memory cell/elements are (or remain) failing bits. In some embodiments, the follow-on erase and verify is performed at a different verify resistance that is closer to a read verify resistance.

FIG. 10C shows a verify memory 1072 following a second follow-on erase and verify operation. Those memory cell/elements with a fail status can be subject to another follow-on erase and verify operation. As shown, in response to such an action, all memory cell/elements all bits are recovered (come into compliance). In some embodiments, this follow-on erase and verify can be performed at a different verify resistance that is closer to a read verify resistance than the previous verify resistance.

Embodiments herein can utilize any suitable programmable resistance element providing the response noted. In particular embodiments, elements change resistance in response to an applied electric field, but do not change resistance by thermal phase change event, such as the transition from a crystalline to amorphous state.

FIGS. 11A to 11C are side cross sectional representations of an element 1176 that can be included in embodiments. Element 1176 can be a two terminal element having one or more resistance change layers 1180 disposed between a first electrode 1178 and a second electrode 1182. FIG. 11A shows an element 1176 in one state in which a resistance between the two electrodes (1178 and 1182) can have one value R1.

FIG. 11B shows element responses in a first part of a resistance setting (e.g., erase) operation. An electric field Ex is applied across the element 1176. As represented by electron 1184, such an erase operation can include an oxidation-reduction reaction. In some embodiments, as represented by positive ion 1186, an erase operation can result in ion conduction. However, other embodiments may not include ion conduction. In a first part of an erase operation, a resistance of resistance change layer(s) may be unchanged, changed only a small amount, or undergoing change (represented by Rx).

FIG. 11C shows an element after the resistance setting operation. A resistance of resistance change layer(s) may have changed (R2≠R1).

According to some embodiments, an electric field opposite to that of FIG. 11B can be applied to change a resistance opposite to that represented by FIGS. 11A to 11C.

Figure 12:
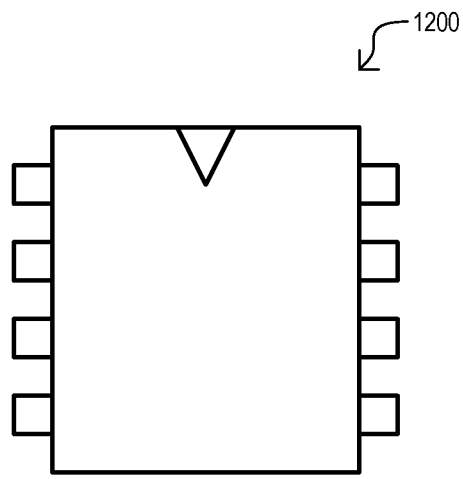
FIG. 12 is a plan view of an integrated circuit device according to an embodiment.

FIG. 12 is a plan view of an integrated circuit (IC) device 1200 according to an embodiment. A device 1200 can include any or all of the various circuit components shown in FIG. 9 and/or can include memory cells and circuits for executing the various methods described herein or equivalents. In this way, an IC device 1200 can include memory cells that store data with greater endurance than conventional devices, which do not include methods for addressing "tail" distribution memory cells/element(s).

While embodiments can include IC device and methods, other embodiments can include electronic devices having operational lifetimes that are increased by including erase and verify methods as described herein, or equivalents. One very particular example of such a device is shown in FIG. 13.

Figure 13:
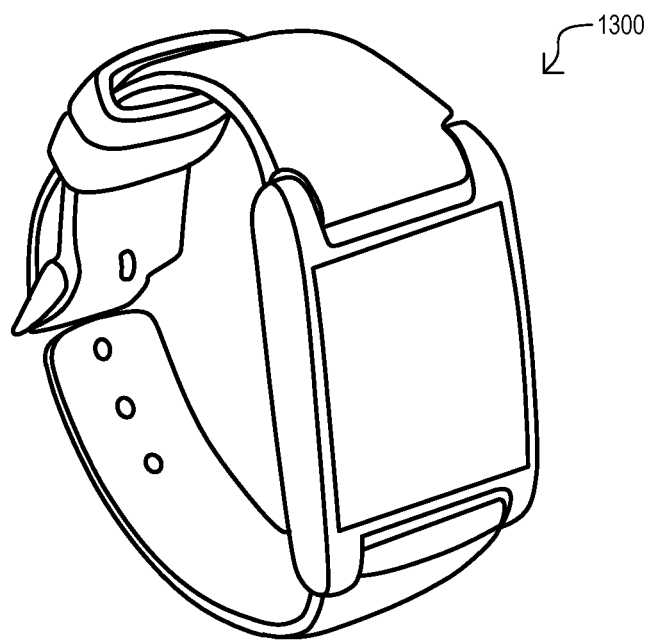
FIG. 13 is a perspective view of an electronic device according to a particular embodiment.

FIG. 13 is a perspective view of a personal medical monitoring (PMM) device 1300. A PMM device 1300 can be worn by a person, and record and/or store data regarding the wearer's health in a nonvolatile memory composed of programmable resistance elements. In such a device, the lifetime of the device can be an important feature, as changing devices can require data transfers and/or failure of the device can lose data and/or jeopardize the wearer's health. Inclusion of erase and verify methods that detect and correction "tail" elements, as described in embodiments herein or equivalents, can result in the lifetime of the device 1300 being extended as compared to a conventional device.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method of setting a resistance of memory elements, comprising:
    applying a first electric field to a plurality of memory elements that are programmable between at least two different resistance states;
    verifying whether the memory elements have a resistance outside of a first limit;
    for memory elements that are not outside of the first limit, applying a second electric field of a same direction as the first electric field, and not applying the second electric field to those memory elements that are outside the first limit; and
    verifying whether the memory elements receiving the second electric field have a resistance outside of a second limit; wherein
    the second limit is between the first limit and a read limit, where a memory element having a resistance below the read limit is determined to store one data value, and a memory element having a resistance above the read limit is determined to store another data value.

2. The method of claim 1, wherein:
    applying the first electric field to a plurality of memory elements is an erase operation; and
    the first limit is a resistance higher than a resistance of the second limit, and the second limit is a resistance higher than a resistance of the read limit.

3. The method of claim 2, wherein:
    the second limit is a resistance less than 50% that of the first limit.

4. The method of claim 2, wherein:
    the second limit is a resistance less than 25% that of the first limit.

5. The method of claim 2, wherein:
    the second limit is a resistance less than 15% that of the first limit.

6. The method of claim 1, further including:
    for memory elements that are not outside of the second limit, applying a third electric field, and not applying the third electrical field to those memory elements that are outside the second limit; and
    verifying whether the memory elements receiving the third electric field have a resistance outside of a third limit; wherein
    the third limit is between the second limit and the read limit.

7. The method of claim 1, wherein:
    applying the second electric field to the memory elements that are not outside of the first limit includes applying more energy to the memory elements than was applied by the first electric field.

8. The method of claim 1, wherein:
    the memory elements each comprise a layer that undergoes a resistance change by an oxidation-reduction reaction in response to electric fields.

9. A method, comprising:
    coupling a plurality of memory elements to a first voltage source by operation of programming circuits;
    verifying whether the memory elements are outside of a first resistance limit by operation of verifying circuits;
    storing the location of any memory elements that are outside of the first resistance limit in verify memory circuits;
    coupling those memory elements at locations stored by the verify memory circuits to a second voltage source that applies a same polarity voltage as the first voltage source by operation of the programming circuits; and
    verifying whether the memory elements are outside of a second resistance limit by operation of the verifying circuits; wherein
    the second resistance limit is between the first resistance limit and a read resistance limit, where a memory element having a resistance below the read resistance limit is determined to store one data value, and a memory element having a resistance above the read resistance limit is determined to store another data value.

10. The method of claim 9, wherein:
    the second voltage source applies a different amount of energy to each memory element than the first voltage source.

11. The method of claim 9, wherein:
    the first resistance limit is higher than the second resistance limit, which is higher than the read resistance limit.

12. The method of claim 9, further including:
    storing a status value for the location of each memory element in the verify memory circuits; and
    setting the status value of a memory element location to a pass value if it outside of the second resistance limit, and to a fail value if it is not outside of the second resistance limit.

13. The method of claim 12, further including:
    selectively coupling memory elements to follow-on voltage sources that apply a same polarity voltage as the first voltage source by operation of the programming circuits, based on the status value of the memory elements stored by the verify memory circuits; and
    after each application of a follow-on voltage, performing a follow-on verify operation that determines whether the memory elements are outside of a follow-on resistance limit by operation of the verifying circuits; and
    after each follow-on verification operation, setting the status value of a memory element location to a pass value if it is outside of a current follow-on resistance limit, and to a fail value if it is not outside of the current follow-on resistance limit; wherein
    each follow-on resistance limit is closer in resistance to the read resistance than the previous follow-on resistance limit.

14. An integrated circuit device (IC), comprising:
    at least one memory array that includes a plurality of memory elements programmable between different resistance states by at least the application of electric fields changing a resistance of at least one layer of the memory elements;
    a controller circuit that includes a verify memory, the controller circuit configured to generate control signals;
    a program circuit configured to apply at least one voltage to selected memory elements in response to predetermined of the control signals;

a verify circuit configured to determine if memory elements are outside of one of at least two different resistance limits in response to predetermined control signals, the resistance limits including a first resistance limit, and a second resistance limit between the first resistance limit and a read resistance; wherein a memory element having a resistance below the read resistance is determined to store one data value, and a memory element having a resistance above the read resistance determined to store another data value;

the program circuit is controlled by the controller circuit to selectively apply follow-on voltages of the same polarity as the at least one voltage to memory elements based on a status value corresponding to the location of the memory elements;

the verify circuit is controlled by the controller circuit to, after each application of a follow-on voltage, perform a follow-on verify operation that determines whether the memory elements are outside of a follow-on verify resistance limit; and the controller circuit is configured to set a status value of a memory element location to a pass value if it is outside of a current follow-on verify resistance limit, and to a fail value if it is not outside of the current follow-on verify resistance limit; wherein each follow-on verify resistance limit is closer in resistance to the read resistance than the previous follow-on verify resistance limit.

15. The IC device of claim 14, wherein:

the application of at least one of the follow-on voltages applies a different amount of energy to its memory cells or cell than an application of a previous of the follow-on voltages.

16. The IC device of claim 14, wherein:

at least one of the follow-on voltage applies more energy to its memory cells than a previous follow-on voltage.

17. The IC device of claim 14, wherein:

the controller circuit includes the verify memory, and the verify memory stores at least locations, status values, and follow-on verify resistance limits for predetermined memory cells.

18. The IC device of claim 14, wherein:

the first resistance limit is higher than the second resistance limit, which is higher than the read resistance.

19. The IC device of claim 14, wherein:

the second limit is a resistance less than 50% that of the first limit.

* * * * *